United States Patent [19]
Mishina et al.

[11] Patent Number: 4,809,443
[45] Date of Patent: Mar. 7, 1989

[54] APPARATUS FOR FIXING ELECTRONIC PARTS TO PRINTED CIRCUIT BOARD

[75] Inventors: Haruo Mishina, Ushiki; Yukio Yamada, Katsuta; Noriaki Mukai, Toride; Yushi Takahashi, Ibaraki, all of Japan

[73] Assignee: Hitachi Techno Engineering Co., Ltd., Tokyo, Japan

[21] Appl. No.: 943,749

[22] Filed: Dec. 19, 1986

[30] Foreign Application Priority Data

Dec. 23, 1985 [JP] Japan ................................ 60-287896

[51] Int. Cl.$^4$ .............................................. F26B 21/06
[52] U.S. Cl. ........................................... 34/73; 134/11; 432/197
[58] Field of Search ............ 34/78, 73; 134/11, 238.5; 432/210, 161, 197

[56] References Cited
U.S. PATENT DOCUMENTS

| | | | |
|---|---|---|---|
| 2,083,012 | 6/1937 | Eastwood | 134/11 X |
| 4,032,033 | 6/1977 | Chu et al. | 134/11 X |
| 4,261,111 | 4/1981 | Rand | 34/78 X |
| 4,612,712 | 9/1986 | Pescatore | 34/78 X |

*Primary Examiner*—William E. Wayner
*Attorney, Agent, or Firm*—Antonelli, Terry & Wands

[57] ABSTRACT

An apparatus for fixing electronic parts to a printed circuit board is disclosed which comprises a vapor generating tank or boiling and generating a thermal medium and a returning tank for receiving the thermal medium containing flux. The vapor generating tank and the returning tank are separated from each other. By utilizing the level difference between the vapor generating tank and the returning tank, the thermal medium is charged into a flux separator and discharged therefrom. Thus, the mixture of the flux into the thermal medium may be reduced and its maintenance work may readily be carried out, thereby reducing a running cost of the apparatus.

6 Claims, 6 Drawing Sheets

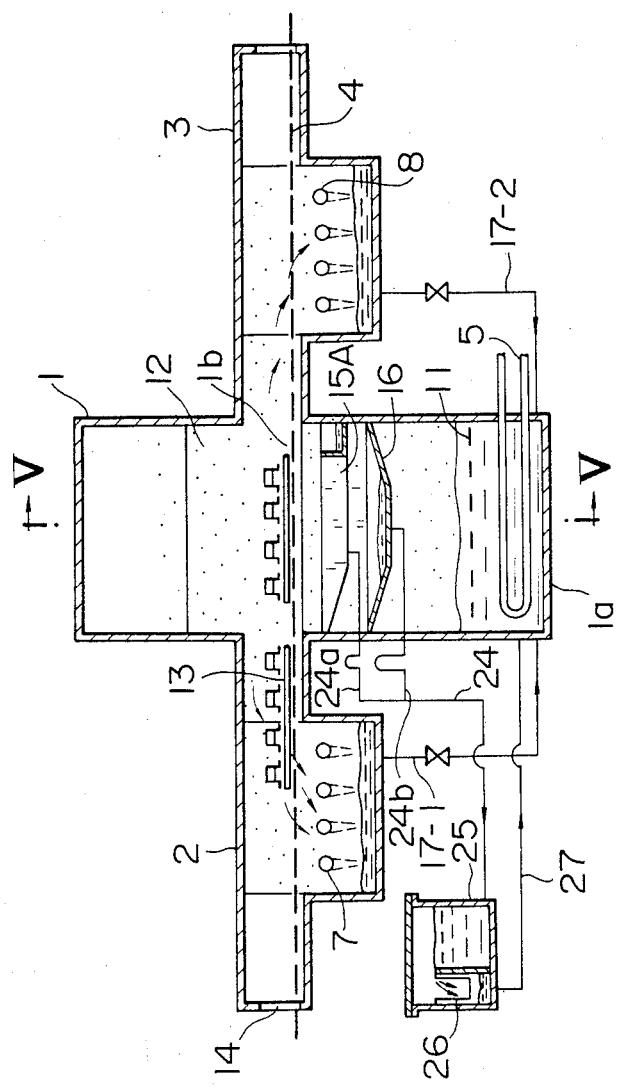

APPARATUS FOR FIXING ELECTRONIC PARTS TO PRINTED CIRCUIT BOARD

BACKGROUND OF THE INVENTION

1. Field of the Invention

The present invention relates to an apparatus for fixing electronic parts to a printed circuit board or substrate, and more particularly to an apparatus suitable for attaching to a high density printed circuit board a variety of electronic parts such as resistors, capacitors, and so-called flat packaged elements from which four-way electrode terminals are extracted in a planar manner.

2. Description of the Prior Art

Recently, a higher density attachment of electronic parts to a printed circuit board has been developed. Since a soldering or brazing operation for attaching electronic parts such as semiconductor chips to a printed circuit board is attained in a final step of the working line, a performance of the electronic parts largely depends upon the quality of the soldering work. Thus, the soldering technique becomes the most important and significant technique in various works in the manufacturing line.

At present, a vapor reflow type soldering apparatus has been proposed which employs a vapor having a large specific weight relative to that of air as thermal medium and heats material to be processed by utilizing its condensing latent heat, in view of needs to enhance a uniformity of temperature distribution within a soldering work furnace and to avoid an undesirable excessive heating of the electronic parts.

In this apparatus, the electronic parts are mounted on a soldering pattern on the printed circuit board, and the printed circuit board is caused to pass through saturated vapor of thermal medium having a large specific weight relative to that of air as described above, by delivering means such as a conveyor, so that the solder on the board is heated and melted. As a result, the electronic parts are soldered on the printed circuit board. Thus, the apparatus has a vapor tank which is a so called vapor reflow reservoir. More specifically, the thermal medium used in such a vapor tank generally comprises a fluorine system inactive organic agent. Its saturated vapor may have a large specific weight (relative to that of the air) of about 20 times, with its molecular weight being at about 820 g/mol under an intended temperature/pressure condition.

Such an apparatus suffers from the following disadvantages.

(1) If the solder for the components to be soldered would be molten within the vapor tank, a part of the solder and a part of flux of the soldering solvent coated on the components to be soldered would fall into a bottom portion of the vapor tank together with the condensed and liquefied thermal medium to be mixed with the stagnant thermal medium. The flux mixed with the thermal medium would stick to a surface of a heater dipped in the thermal medium to reduce its heat transfer performance and to corrode the heater. Thus, there is a high maintenance cost.

(2) The flux mixed with the thermal medium would prevent the boiling action of the thermal medium to delay a responsibility to a change in thermal load. It would be temporarily difficult to maintain constant a level of the vapor surface of the saturated vapor. In order to avoid this phenomenon, it would be necessary to increase the vapor amount, which would need an increased electric power of the heater and an increased amount of cooling water for the heater. This causes an increase of the running cost of the overall system.

(3) The above-mentioned problems would be encountered. Thus, a flux separating means would be needed. However, in the conventional apparatus, since the generation of vapor and return of the flux are carried out in the same tank, it is necessary to process a large amount of thermal medium. Thus, there is needed a large capacity the flux separating means which increases the cost for the overall system.

Incidentally, such a conventional apparatus is disclosed in, for example, U.S. Pat. No. 4,389,797.

SUMMARY OF THE INVENTION

An object of the present invention is to provide an apparatus for fixing electronic parts to a printed circuit board comprising a vapor generating tank for boiling and evaporating thermal medium, a returning tank for collecting a mixture liquid of flux and the thermal medium condensed and liquefied after heating a material to be processed, the returning tank being located at a level different from that of the vapor generating tank, and a flux separating means for removing the fluxed mixed into the condensed and liquefied thermal medium, the flux separating means being located at a position where the condensed and liquefied thermal medium is charged into and discharged from the separating means by utilizing the level difference between the returning tank and the vapor generating tank.

BRIEF DESCRIPTION OF THE DRAWINGS

In the accompanying drawings:

FIG. 4 is a cross-sectional view showing an apparatus for fixing electronic parts to a printed circuit board in accordance with second embodiment of the invention;

DESCRIPTION OF THE PREFERRED EMBODIMENTS

The present invention will now be described by way of example with reference to the accompanying drawings.

Figure 1:
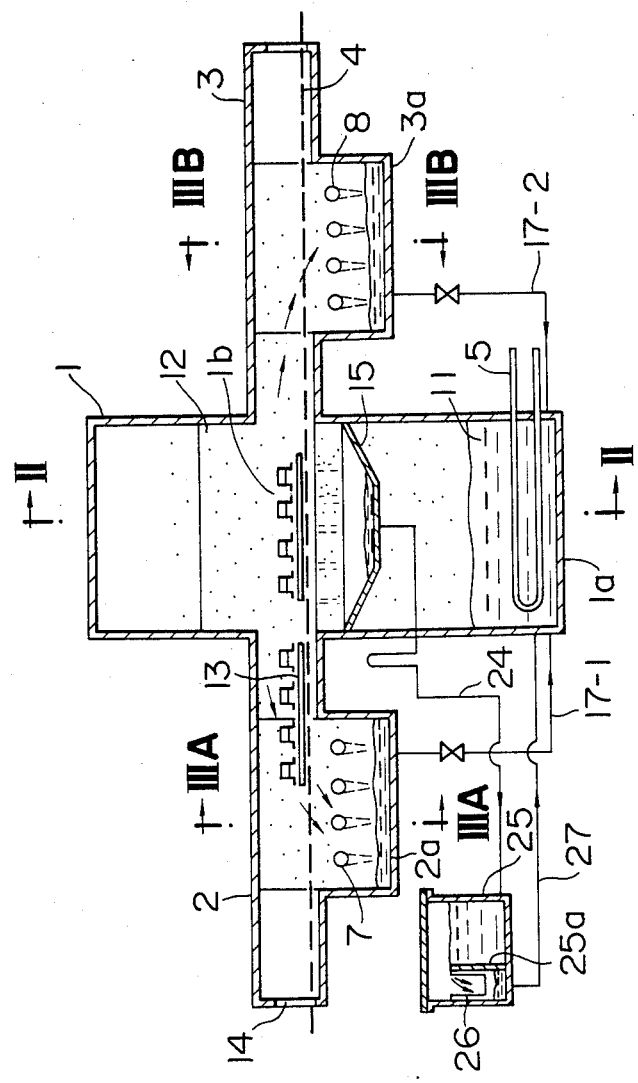
FIG. 1 is a cross-sectional view showing an apparatus for fixing electronic parts to a printed circuit board in a first embodiment of the present invention.
Figure 2:
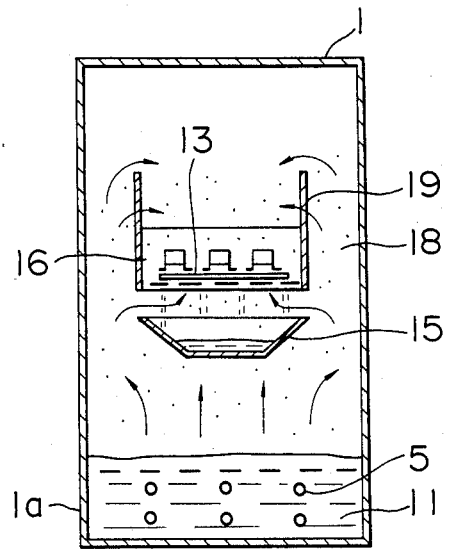
FIG. 2 is a cross-sectional view taken along the line II—II of FIG. 1.

In FIGS. 1 and 2, designated generally by reference numeral 1 is a vapor tank composed integrally of a vapor generating tank 1a for heating and boiling thermal medium 11 and a furnace tank section 1b for heating and melting a solder for a solder member 13 to be soldered. Reference numeral 2 denotes inlet side delivery path through which the solder member 13 is delivered into the vapor tank 1. Reference numeral 3 denotes an outlet side delivery path through which the solder member 13 is discharged from the vapor tank 1. Reference numeral 4 denotes a conveyor for the solder member 13. A heater 5 is provided in a bottom portion of the vapor tank 1a, i.e., the vapor generating section.

An inlet side cooling coil 7 is disposed in the inlet side delivery path 2. An outlet side cooling coil 8 is disposed in the outlet side delivery path 3. Reference numeral 14 denotes an opening of the inlet side delivery path 2.

A return tank 15 is provided just below the furnace tank section 1b within the vapor tank 1. The returning tank 15 functions as a receiving tank for receiving liquefied thermal medium condensed and falling downwardly after its saturated vapor has heated the solder member 13.

Reference character 17-1 denotes a return pipe through which the liquefied thermal medium is to be collected from a liquid receiving portion 2a of the inlet side delivery path 2 into the vapor generating tank 1a. Reference character 17-2 denotes a return pipe through which the liquefied thermal medium is to be collected from a liquid receiving portion 3a of the outlet side delivery path 3 into the vapor generating tank 1a. A partition wall 19 constitutes the furnace tank section 1b of the vapor tank 1.

Reference numeral 25 denotes a flux separating means for removing flux mixed into the thermal medium that has been condensed and liquefied in the furnace tank section 1b within the vapor tank 1. The flux separating means is located at a midpoint in level between the returning tank 15 and the vapor generating tank 1a. The separating means 25 causes the flux to be removed from the liquefied thermal medium that has entered from the returning tank 15 through a dam 25a and a filter element 26.

Reference numeral 24 denotes a pipe for connecting the returning tank 15 and the flux separating means 25 to each other, reference numeral 27 denotes a return pipe for connecting the flux separating means 25 and the vapor generating tank 1a to each other.

The operation of the thus constructed apparatus in accordance with the present invention will now be described.

The thermal medium 11 stagnant in the bottom portion of the vapor tank 1, i.e., the vapor generating tank 1a is heated by the heater 5 to be boiled and vaporized. The saturated vapor 12 of the thermal medium is raised so that a part of the vapor heats the lower surface of the solder member 13 and the rest of the vapor passes through a clearance between the partition wall 19 and an inner circumferential wall of the vapor tank 1 to heat the upper surface of the solder member 13.

At this time, a part of the saturated vapor 12 is condensed and liquefied to fall down together with the flux or the like, and is stagnant in the returning tank 15 while the other of the saturated vapor 12 leaks into the inlet side delivery path 2 and the outlet side delivery path 3.

Figure 3A:
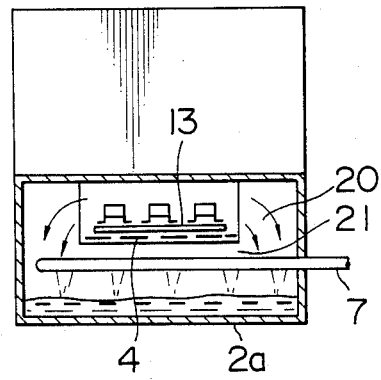
FIG. 3A is a cross-sectional view taken along the line IIIA—IIIA of FIG. 1.
Figure 3B:
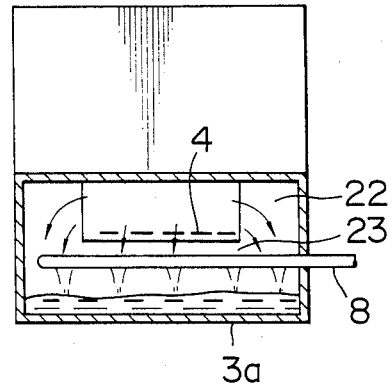
FIG. 3B is a cross-sectional view taken along the line IIIB—IIIB of FIG. 1.

In the case where the solder member 13 is not disposed on the conveyor 4, since a density of the saturated vapor 12 is much larger than that of the air, as indicated in the outlet side delivery path 3 of FIG. 1 and in FIG. 3B by arrows, the leaking saturated vapor 12 enters into an outlet side lower space 23 through the conveyor 4 and an outlet-side side wall clearance 22. The saturated vapor 12 is condensed and liquefied by the outlet side cooling coil 8 and falls onto the liquid receiving portion 3a.

The thermal medium that has fallen in the liquid receiving portion 3a and has been liquefied is collected through the return pipe 17a into the thermal medium reservoir section of the vapor generating tank 1a.

It should be noted that the function of the condensation, liquefaction and collection of the thermal medium is the same on both the inlet and outlet sides.

The liquefied thermal medium that has fallen in the returning tank 15 while containing the flux or the like flows downwardly through the pipe 24 into the flux separating means 25 due to the level difference between the returning tank 15 and the flux separating means 25. As the temperature of the liquefied thermal medium entering into the flux separating means 25 is gradually decreased, the flux in the liquefied thermal medium is solidified and separated upwardly, whereupon the flux overflowing over the dam 25a is collected by the filter element 26.

The thermal medium from which the flux has been removed is collected into the thermal medium reservoir section of the vapor generating tank 1a downwardly through the return pipe 27 due to the level difference between the flux separating means 25 and the vapor generating tank 1a.

The apparatus in accordance with the foregoing embodiment of the invention has the following advantages.

(1) Since the foreign matter such as flux is not admixed with the thermal medium 11 within the vapor generating tank 1a, any adhesive is not stuck to the surface of the heater 5 dipped into the thermal medium 11. Therefore, any degradation in heat transfer performance is not noticed. In addition, it is possible to prolong an interval of maintenance such as inspection and cleaning of the heater 5 and to readily carry out such maintenance work.

Also, there is no hindrance against the boiling and vaporization of the thermal medium 11. Therefore, there is no delay caused by the thermal load change. Thus, it is possible to save electric power for the heater 5.

(2) The amount of the thermal medium containing the flux only corresponds to the amount of the thermal medium that has been condensed and liquefied from the solder member 13 in the furnace tank section 1b of the vapor tank 1 and has fallen onto the returning tank 15. Thus, the thermal medium containing the flux is very small. Therefore, it is possible to make the flux separating means 25 compact in size.

Also, since the level difference between the returning tank 15 for the condensed and liquefied thermal medium and the vapor generating tank 1a is utilized, it is possible to dispense with any recirculation pump and to reduce the cost and electric power consumption therefor.

Another embodiment of the present invention will now be described with reference to FIGS. 4 and 5 in which the same reference numerals are used to indicate like components and members shown in FIGS. 1 and 2 and explanation therefor will be omitted.

Figure 5:
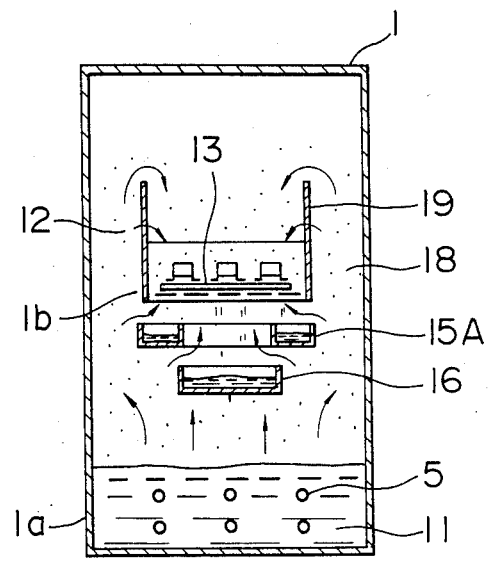
FIG. 5 is a cross-sectional view taken along the line V—V of FIG. 4.

In the embodiment shown in FIGS. 4 and 5, a two-stage returning tank means composed of returning tanks 15A and 16 is arranged in the vapor tank 1.

The first returning tank 15A and the second returning tank 16 are arranged so as not to prevent the flow of the saturated vapor 12 of the thermal medium as shown in FIG. 5. The first returning tank 15A has receiving trays on both sides, and the second returning tank 16 has a tray centrally so that the liquefied thermal medium falling downwardly past the first returning tank 15A is received by the second returning tank 16.

Pipes led from the respective returning tanks into the flux separating means 25 are composed of a branch conduit 24a connected to the first returning tank 15A and a branch conduit 24b connected to the second returning tank 16, which conduits are joined together into the pipe 24.

According to this embodiment, substantially the same effect as that of the preceding embodiment shown in FIGS. 2 and 3 may be obtained, and in addition, the saturated vapor 12 of the thermal medium is likely to enter below the lower surface of the solder member 13 as indicated by the arrow in FIG. 5.

It is obvious for one skilled in the art to provide a plurality (three or more) of returning tanks for the thermal medium, and therefore, such modification is not shown in the drawings.

A still another embodiment of the invention will now be described with reference to FIGS. 6 and 7, in which the same reference numerals are used to designates the like members or components in the embodiment shown in FIGS. 1 and 2, and hence, explanation therefor will be omitted.

Figure 7:
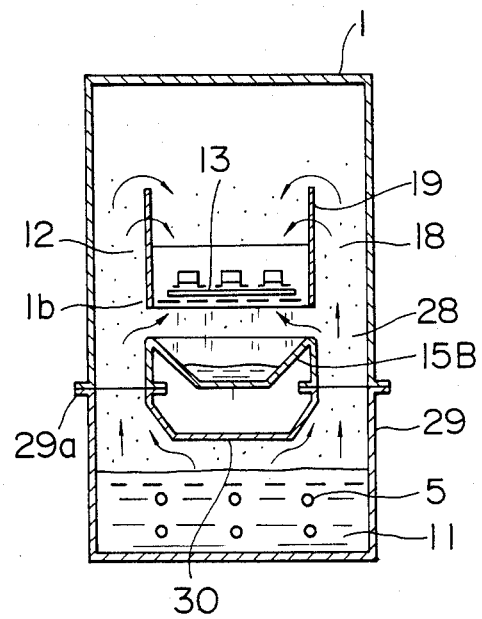
FIG. 7 is a cross-sectional view taken along the line VII—VII of FIG. 6.
Figure 6:
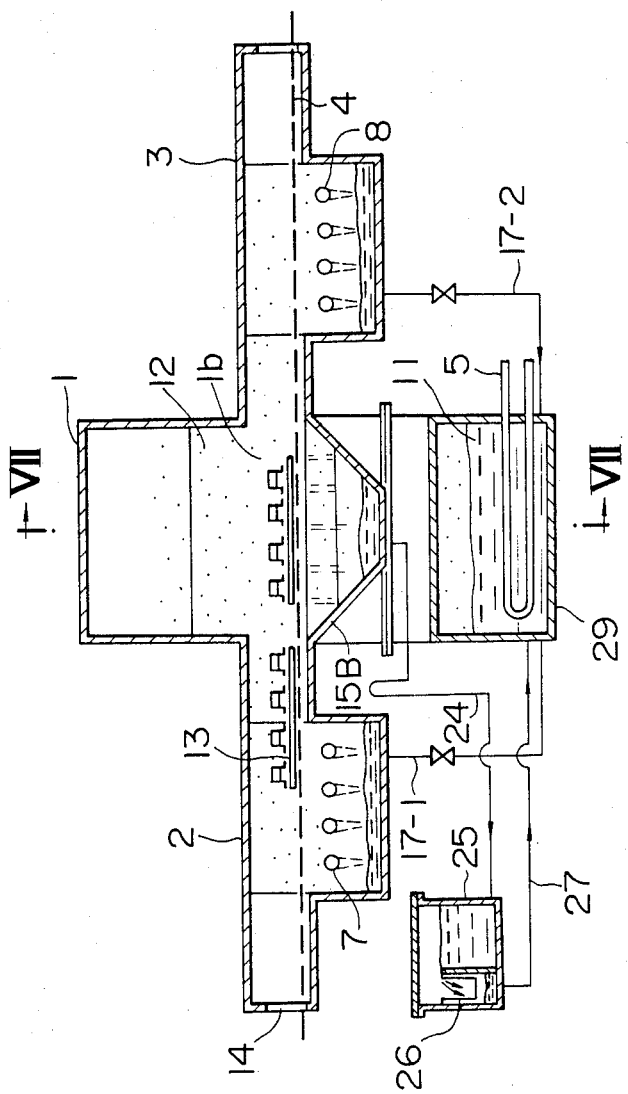
FIG. 6 is a cross-sectional view showing an apparatus for fixing electronic parts to a printed circuit board in accordance with a third embodiment of the invention.

FIGS. 6 and 7 show the embodiment in which the bottom of the returning tank for the condensed and liquefied thermal medium is held out of contact with the vaporized thermal medium.

Also, in this embodiment, the vapor generating tank 30 is not integral with the vapor tank 1 so that it may be separated from the vapor tank as discussed below 1.

The returning tank 15B is provided with a shield plate 30 on the rear side of the returning tank 15B, and is so constructed that the boiled and vaporized thermal medium is not brought into direct contact with the receiving tray of the returning tank 15B.

A vapor generating tank 29 is separatably formed with the vapor tank 1 through a flange 29a. The shield plate 30 formed in the returning tank 15B is connected to the flange 29a of the vapor generating tank 29.

The saturated steam 12 of the thermal medium boiled and vaporized by the heater 5 disposed within the vapor generating tank 29 is raised through a clearance 28 from where a portion of the vaporized thermal medium heats the lower surface of the solder member 13 and the rest of the thermal medium is allowed to pass through the clearance 18 between the partition wall 19 and the vapor tank inner wall to heat the upper surface of the solder member. The subsequent operation therefor is the same as that in the embodiments shown in FIGS. 1 and 4, and hence, explanation therefor will be omitted.

According to the embodiment shown in FIGS. 6 and 7, it is expected that the same effect as in the foregoing embodiment is ensured and it is possible to effectively heat the solder member 3 with the saturated vapor 12 of the thermal medium.

Also, since the vapor generating tank 29 is separated from the vapor tank 1, the lower portion of the vapor tank 1 is made small in size, and the belt of the conveyor 4 may be arranged to pass between the returning tank 15B and the vapor generating portion so that an effective length of the belt may be shortened to a minimum necessary length and also the collection efficiency of the thermal medium may be enhanced.

A still another embodiment of the invention will now be described with reference to FIG. 8, in which the same reference numerals are used to denote the like members or components in FIG. 1 and explanation therefor will be omitted.

Figure 8:
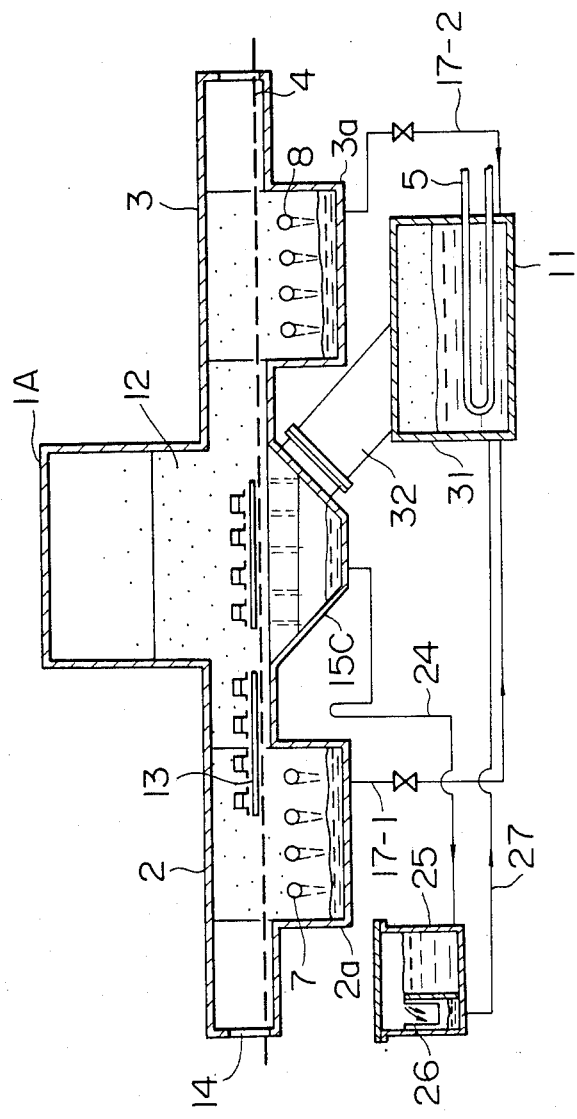
FIG. 8 is a cross-sectional view showing an apparatus for fixing electronic pats to a printed circuit board in accordance with a fourth embodiment of the invention.

FIG. 8 shows by way of example the vapor generating tank formed independently of the working section.

In FIG. 8, the returning tank 15C is adapted to heat the solder member 13 and to collect the condensed and liquefied thermal medium. The returning tank 15C constitutes a bottom portion of a vapor tank 1A. A vapor generating tank 31 is formed independently of the vapor tank 1A. The vapor generating tank 31 is arranged at a level lower than those of the returning tank 15C and the flux separating means 25. A side portion (located above the reservoir level of the liquefied thermal medium) of the returning tank 15C is connected to the upper surface of the vapor generating tank 31 through a duct 32.

The saturated vapor 12 of the thermal medium generated from the vapor generating tank 31 is introduced through the duct 32 from the side surface of the returning tank 15C into the vapor tank 1 to heat the solder member 13. The subsequent operation therefor is the same as that in the embodiments shown in FIGS. 1 and 4, and therefore, explanation therefor will be omitted.

According to the embodiment of FIG. 8, the same effect as that of the foregoing embodiments, and in addition, the following effect may be ensured.

Since the vapor generating tank 31 is sepatrated from the vapor tank 1, the most heavy vapor generating tank 31 may be independently supported by suitable supports, and therefore, it is possible to make small and thin in dimension the vapor tank 1, the inlet side delivery path 2, the outlet side delivery path 3 and the like. Also, it is possible to readily carry out the maintenance work of the vapor generating tank 31 and the returning tank 15C.

As described above, according to the present invention, the mixture between the thermal medium and the flux may be reduced, thereby facilitating the maintenance work and reducing the running cost of the vapor heating type soldering apparatus.

What is claimed is:

1. An apparatus for fixing electronic parts to a print board, having a vapor tank in which a saturated vapor of thermal medium is brought into contact with a material to be processed and a solder of the material to be soldered is heated and melted, thereby carrying out a soldering operation, said apparatus comprising a vapor generating tank means for boiling and vaporizing said thermal medium, a returning tank means for collecting a mixture of liquid flux and the thermal medium condensed and liquefied after heating said material to be processed, a convey or means for delivering the material to be soldered and located above the returning tanks means, said vapor generating tank and returning tank means being located in a single tank with said returning tank means, being so dimensioned that substantially all of the condensed liquid flue falling from the conveyor means is directed to the returning tank means and a flux separating means for removing the flux mixed into the condensed and liquefied thermal medium, said flux separating means being located at a position where the condensed and liquefied thermal medium is charged into said discharged from said flux separating means by utilizing the level difference between said returning tank means and said vapor generating tank means.

2. The apparatus according to claim 1, wherein said vapor generating means and said returning tank means are connected to each other through a duct, so that the generated saturated vapor of the vapor generating tank means is not brought into direct contact with a lower portion of said returning tank means.

3. The apparatus according to claim 1, wherein said flux separating means is located at a midpoint in level between said returning tank means and said vapor generating means, said flux separating means including a filter element for removing the flux from the liquefied thermal medium flowing therethrough from said returning tank means, thereby returning back to the vapor generating tank means the thermal medium from which the flux has been removed.

4. The apparatus according to claim 1, wherein said returning means comprises at least one receiving tray.

5. The apparatus according to claim 3, wherein said returning means comprises at least one receiving tray.

6. An apparatus for soldering components comprising a vapor generating tank means for boiling and vaporizing a thermal medium for contacting components to be soldered, a returning tank means for collecting a mixture of liquid flux and the thermal medium condensed and liquified after heating the components to be soldered, said returning means and said vapor generating tank means being arranged in a single tank with the returning tank means being spaced beneath a conveyor means for delivering the components to be soldered, said returning tank means being so dimensioned that substantially all of the condensed liquid & flux falling from the conveyor means is directed to the returning tank means, and a flux separating means for removing the flux mixed into the condensed and liquified thermal medium collected by said returning tank means.

* * * * *